United States Patent [19]

Forward

[11] 4,158,787

[45] Jun. 19, 1979

[54] ELECTROMECHANICAL TRANSDUCER-COUPLED MECHANICAL STRUCTURE WITH NEGATIVE CAPACITANCE COMPENSATION CIRCUIT

[75] Inventor: Robert L. Forward, Oxnard, Calif.

[73] Assignee: Hughes Aircraft Company, Culver City, Calif.

[21] Appl. No.: 904,169

[22] Filed: May 8, 1978

[51] Int. Cl.² .................... H01L 41/10; H02K 5/24
[52] U.S. Cl. ........................... 310/51; 310/319; 310/321; 310/323; 310/326
[58] Field of Search ............... 310/319, 326, 327, 321, 310/323, 51

[56] References Cited

U.S. PATENT DOCUMENTS

| 2,416,337 | 2/1947 | Mason | 310/326 X |
|---|---|---|---|
| 3,029,356 | 4/1962 | Renaut | 310/319 |
| 3,179,823 | 4/1965 | Nesh | 310/326 X |
| 3,400,284 | 9/1968 | Elazar | 310/319 |

*Primary Examiner*—Mark O. Budd
*Attorney, Agent, or Firm*—Paul M. Coble; W. H. MacAllister

[57] ABSTRACT

Arrangements are disclosed for substantially reducing the effect of the inherent transducer capacitance in a transducer-coupled electromechanical system which is subject to vibrational movement. Electrical circuitry is coupled across the transducer output to provide a negative capacitance having a magnitude substantially the same as that of the inherent transducer capacitance, thereby substantially nullifying the inherent transducer capacitance and enabling improved damping (including low-noise damping) to be achieved.

7 Claims, 7 Drawing Figures

U.S. Patent  Jun. 19, 1979  4,158,787
Fig. 1.
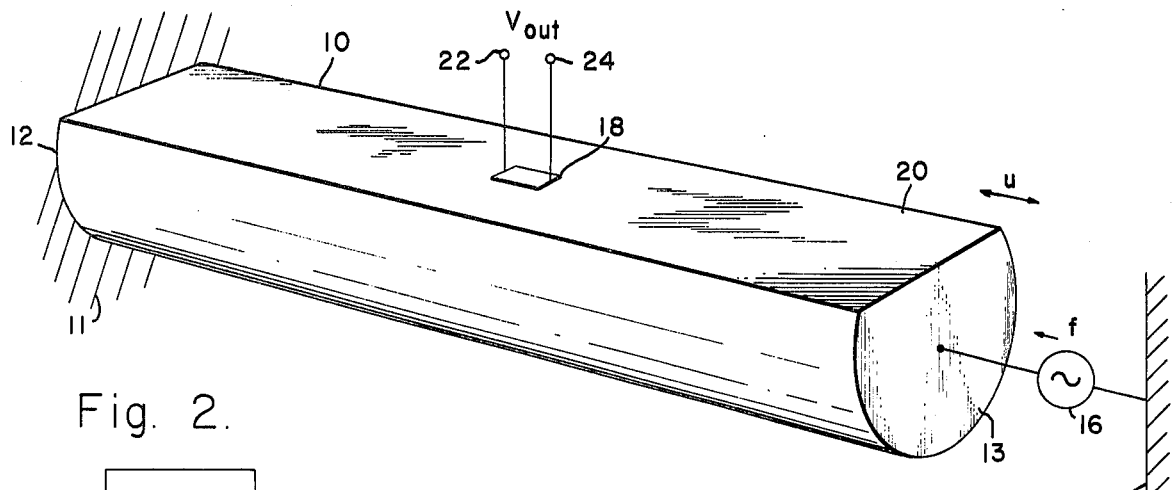
Fig. 2.
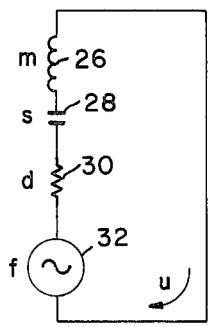
Fig. 3.
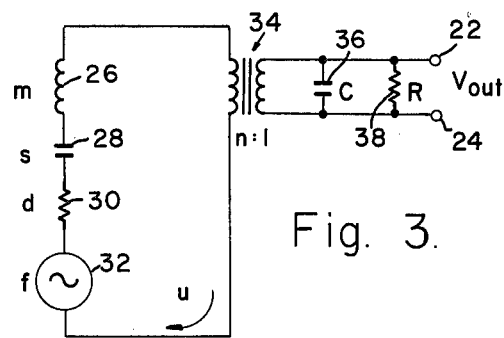
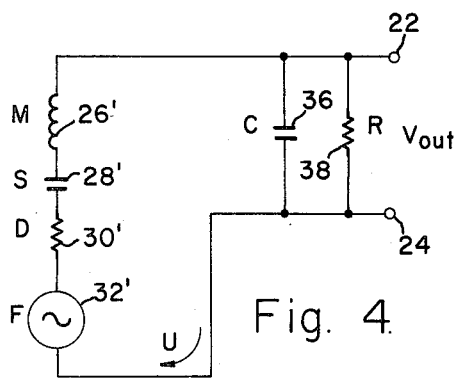
Fig. 4.
Fig. 5.
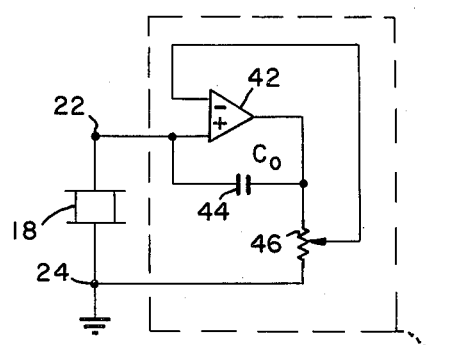
Fig. 6.
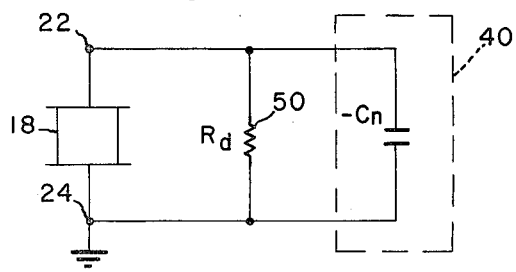
Fig. 7.
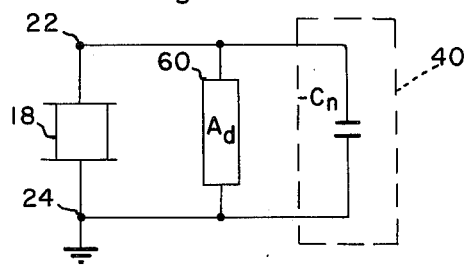

ELECTROMECHANICAL TRANSDUCER-COUPLED MECHANICAL STRUCTURE WITH NEGATIVE CAPACITANCE COMPENSATION CIRCUIT

BACKGROUND OF THE INVENTION

This invention relates to electromechanical transducer-coupled vibrating mechanical structures, and more particularly, it relates to an arrangement for compensating for the inherent transducer capacitance of such structures.

A significant source of error in high precision mechanical and electromechanical structures is vibration. Antennas, optical structures, pointing and tracking systems, seeker heads, gravitational and inertial sensors, and guidance platforms can suffer a degradation in performance from external excitation by the local acoustic and vibrational environment.

In the past, the effects of externally induced vibrations in large mechanical structures have been mitigated by such brute-force techniques as stiffening the structure, adding massive mechanical dampers, covering the structure with viscoelastic damping material, or adding acoustic shielding and vibration isolators to shield the structure from the environment.

A further approach to mitigating the aforementioned vibration effects involves electronically damping or controlling the vibrations. In order to accomplish this, an electromechanical transducer, such as a piezoelectric strain transducer, is mounted on the vibrating mechanical structure to provide an electrical signal responsive to the vibrational motion of the structure. This electrical signal may be either applied to a damping resistor connected across the transducer output terminals or fed to electronic processing circuitry for developing an appropriate control signal which is fed back to the mechanical structure via a further electromechanical transducer. Regardless of the particular approach employed, the inherent capacitance of the signal-extracting electromechanical transducer significantly limits the degree of coupling to the external electronic circuitry. This, in turn, limits the degree of electronic damping or control which may be achieved.

In my co-pending application entitled "Passive Vibration Damping System—Active Vibration Damping System", Ser. No. 901,550, filed May 1, 1978, an arrangement is disclosed for tuning out the inherent shunt capacitance of the transducer by connecting across the transducer output an inductor which provides the appropriate inductance to resonate with the transducer inherent capacitance. Such an arrangement is highly effective in eliminating the effect of the transducer capacitance at vibration frequencies in the vicinity of the inductance-capacitance resonant frequency, although its effectiveness is reduced as the vibration frequency departs from the resonant frequency.

SUMMARY OF THE INVENTION

It is an object of the present invention to provide an arrangement for use with a transducer-coupled electromechanical system which is subject to vibrational movement for substantially reducing the effect of the inherent transducer capacitance over a wide range of vibration frequencies.

It is a further object of the invention to provide an improved arrangement for electronically damping or controlling vibrational movement of a mechanical member in an electromechanical system including a system-coupling electromechanical transducer.

It is still another object of the invention to provide a vibration damping arrangement for an electromechanical system of the foregoing type which achieves superior damping over a wide range of frequencies with minimal noise.

In an electromechanical system according to the invention, an electromechanical transducer is mounted on a mechanical member which is subject to vibrational movement to provide an electrical signal responsive to the vibrational movement. Electrical circuitry is coupled between the transducer output terminals to provide a negative capacitance of a value cancelling a substantial portion of the capacitance inherent in the electromechanical transducer. Preferably, the negative capacitance has a magnitude substantially the same as that of the inherent transducer capacitance.

Additional objects, advantages and characteristic features of the invention will become apparent from the following detailed description of preferred embodiments of the invention when considered in conjunction with the accompanying drawing.

BRIEF DESCRIPTION OF THE DRAWING

In the accompanying drawing:

FIG. 1 is a perspective view illustrating an exemplary electromechanical transducer-coupled mechanical structure of the type with which the present invention is concerned;

FIG. 2 is a schematic diagram of an electrical circuit which is analogous to the mechanical system of FIG. 1 without the electromechanical transducer;

FIG. 3 is a schematic diagram of an electrical circuit which is analogous to the mechanical system of FIG. 1 including the transducer;

FIG. 4 is a schematic diagram of the circuit of FIG. 3 after an impedance transformation;

FIG. 5 is a schematic circuit diagram illustrating an arrangement according to one embodiment of the present invention; and FIGS. 6 and 7 are schematic circuit diagrams illustrating respective further embodiments of the invention.

DESCRIPTION OF PREFERRED EMBODIMENTS

Referring to FIG. 1 with greater particularity, an exemplary mechanical structure is shown in the form of an elastic bar 10 of mass m having one end 12 fixed to a wall 11 and the other end 13 connected to a wall 14 by means of an exciter 16. The exciter 16 applies a force f to the bar 10 causing its free end 13 to move with a velocity u. Movement of the bar 10 is opposed by mechanical damping d, such as friction, and by elastic compliance or springiness s associated with the bar 10.

An electrical signal indicative of the motion of the bar 10 may be obtained by means of an electromechanical transducer 18 mounted on a flat surface 20 of the bar 10 and having a pair of output terminals 22 and 24 between which the transducer output voltage $v_{out}$ appears. As a specific example for illustrative purposes, the transducer 18 may be a barium titanate piezoelectric strain transducer 2.54 cm long by 0.64 cm wide and 0.028 cm in thickness for an aluminum bar 10 having a volume of 4,000 cc and a weight of 10 kg. The voltage $v_{out}$ may be used to provide a direct indication of a sensed physical quantity related to the motion of the bar, or alternatively, may be applied across a resistive element to provide damping of the bar vibrations, or as a further alternative, may be introduced into a feedback loop for achieving low-noise damping or other beneficial effects.

Using well-known analogies between electrical and mechanical systems (see, for example, *American Institute of Physics Handbook*, Dwight E. Gray, Editor, McGraw-Hill Book Co., 1972, pages 3-166 through 3-170), the mechanical system of FIG. 1 can be represented by the analogous electrical circuit of FIG. 2. As shown in FIG. 2, the mass m of bar 10 is analogous to an electrical inductance and is represented by inductor 26, the compliance s is analogous to an electrical capacitance and is represented by capacitor 28, the mechanical damping d is analogous to an electrical resistance and is represented by resistor 30, and the driving force f provided by the exciter 16 is analogous to an electrical voltage and is represented by voltage source 32. The velocity u of the end 13 of the bar 10 in response to the driving force f is analogous to an electrical current flowing through the circuit elements 26, 28, 30 and 31. The resonant angular frequency $\omega$ of the mechanical system of FIG. 1 (and also the analogous electrical circuit of FIG. 2) is given by $\omega^2 = 1/ms$, and the quality factor Q of the resonance is given by $Q = \omega m/d$.

The circuit of FIG. 2 represents the behavior of the mechanical system of FIG. 1 without the transducer 18. However, when the transducer 18 is considered, the behavior of the system becomes represented by the analogous electrical circuit of FIG. 3. In FIG. 3 transducer 18 is represented by a transformer 34 having a "turns ratio" of n:1. This transform turns ratio is not a pure dimensionless number as in a simple electronic circuit, but rather includes units that indicate the transformation of mechanical quantities to electrical quantities. The inherent electrical capacitance C of the transducer 18 and any damping resistance R across the transducer are represented by capacitor 36 and resistor 38, respectively, connected across the secondary winding of the transformer 34.

An equivalent circuit representing the behavior of the circuit of FIG. 3 but omitting the transformer 34 can be made by replacing the various circuit components in series with the transformer primary winding with respective transformed equivalents. The resultant equivalent circuit is shown in FIG. 4. In FIG. 4 the mass m is represented by an inductor 26' of inductance M, the spring compliance s by capacitor 28' of capacitance S, the damping d by resistor 30' of resistance D, and the force f and velocity u by a voltage F and current U, respectively. Capacitor 36 and resistor 38 are unaffected by the transformation. The relationships between the original and transformed circuit parameters are given below in Table I (where n is the aforementioned transformer turns ratio):

TABLE I $M = m/n^2$
$S = n^2 s$
$D = d/n^2$
$F = f/n$
$U = un$.

As may be seen from FIG. 4, the damping resistor 38 connected between the transducer output terminals 22 and 24 is effectively connected in parallel with capacitor 36, and as a result, the transducer provides a current shunting effect which may impose a significant limitation on the effectiveness of the damping resistor or other external circuitry coupled thereto. For example, if the reactive impedance provided by capacitor 36 were 1 megohm and the resistance R of the resistor 38 were 10 kilohms, then almost all of the current in the parallel RC network would flow through the resistor 38. Thus, most of the energy would be absorbed, providing increased damping in the circuit of FIG. 4 over that provided by the mechanical damping D alone. For higher levels of damping, it would be desirable to increase the resistance R to higher values. However, if, for example, the resistance R were increased to 100 megohms, then almost all of the current in the parallel RC network would flow through the capacitor 36, and very little energy would be absorbed by the resistor 38. Thus, there would be little increase in damping for the circuit of FIG. 4.

In accordance with the present invention, an electrical circuit connected between the output terminals of the transducer 18 develops a negative capacitance of a value to substantially nullify the inherent transducer capacitance and thereby enable improved damping and other beneficial effects to be achieved. As illustrated in FIG. 5, a negative capacitance circuit 40 is connected between output terminals 22 and 24 of the transducer 18. A specific exemplary negative impedance circuit which may be used for the negative capacitance circuit 40 is given in FIG. 3.71(a), pp. 96 & 97, of the handbook *Applications Manual for Computing Amplifiers for Modelling, Measuring, Manipulating & Much Else*, published in 1965 by Philbrick Researches, Inc., Nimrod Press Inc., Boston, Mass.

The specific exemplary negative capacitance circuit 40 shown in FIG. 5 includes an operational amplifier 42 having a non-inverting input terminal connected to transducer output terminal 22. A capacitor 44 providing a capacitance $C_o$ is connected between the non-inverting input terminal and the output terminal of the operational amplifier 42. Connected between the operational amplifier output terminal and the transducer output terminal 24 is a potentiometer 46 having a moveable tap which, in turn, is connected to the inverting input terminal of operational amplifier 42. It is pointed out that power supply connections and compensating circuitry have been omitted from FIG. 5 for clarity. It should be understood, however, that a suitable DC power supply and compensating circuitry may be employed as is well known in the art.

The negative capacitance circuit 40 provides a negative capacitance $-C_n$ of a magnitude which cancels a substantial portion of the inherent capacitance C of the transducer 18. Preferably, the magnitude of the negative capacitance $-C_n$ is made substantially equal to (e.g., within about 1-2% of) the magnitude of the inherent capacitance C, although these values should not be made exactly equal in order to preclude any tendency for the circuit to oscillate. Moreover, it has been found that maximum stability operation of the circuit can be achieved when capacitance $C_o$ of capacitor 44 is equal to the inherent transducer capacitance C and when the tap of potentiometer 46 is set so that approximately 50% of the output voltage from the operational amplifier 42 is fed back to the inverting input terminal. It should be understood that the capacitance $C_o$ need not be equal to the inherent transducer capacitance C; however, when the capacitance $C_o$ differs substantially from the capacitance C, the tap on potentiometer 46 may have to be adjusted in the same ratio as the ratios of the capacitances C and $C_o$.

As was indicated above, vibration damping of a mechanical system of the type shown in FIG. 1 may be achieved by connecting an external damping resistor between the transducer output terminals 22 and 24. A damping arrangement for the system of FIG. 1 in accordance with an embodiment of the present invention is illustrated in FIG. 6. In the arrangement of FIG. 6 an external damping resistor 50 providing a resistance $R_d$ is connected between output terminals 22 and 24 of the transducer 18 in parallel with negative capacitance circuit 40. As was explained above, the negative capacitance $-C_n$ provided by the circuit 40 substantially nullifies the current shunting effect of the inherent capacitance of the transducer 18, and as a result, the use of relatively large damping resistances $R_d$ (of around 100 megohms, for example) will provide much greater damping of the mechanical vibrations than in the absence of the negative capacitance circuit 40. Moreover, since the arrangement of FIG. 6 is relatively insensitive to frequency, the aforementioned damping may be achieved over a wide range of vibration frequencies, thereby facilitating damping of many vibrational modes simultaneously.

In accordance with a further embodiment of the invention, illustrated in FIG. 7, damping of the mechanical system of FIG. 1 may be achieved with the introduction of less noise than in the embodiment of FIG. 6. In the arrangement of FIG. 7 a special "electronically cooled" low-noise-temperature resistor 60, termed an "absorbor", is connected between transducer output terminals 22 and 24 in parallel with negative capacitance circuit 40. An absorbor is defined as a device that uses a power source and a sensing means to create an out-of-phase copy of an incoming signal which, when combined with the incoming signal, cancels the energy content of the incoming signal. An absorbor emits noise voltages only to the extent that it is not perfect (a perfect absorbor emits no noise). An absorbor provides an effective low-noise-temperature resistance, termed as "absorbance", which is measured in the traditional dimension of ohms. Examples of specific circuits which may be employed for the absorbor 60 are the circuit of FIG. 1 of my co-pending application Ser. No. 881,296, filed Feb. 27, 1978, and any of the circuits of FIGS. 2, 5 and 7 of my co-pending application Ser. No. 838,511, filed Oct. 3, 1977, both applications being entitled "Network For Simulating Low-Noise-Temperature Resistors".

The absorber 60 of the circuit of FIG. 7 provides an absorbance $A_d$ which may have the same ohmic value as the resistance $R_d$ in the circuit of FIG. 6 and thereby enables the same degree of vibration damping to be achieved as the FIG. 6 circuit. However, the absorber 60 introduces far less noise into the system than the resistor 50. In fact, the abosrbor 60 adds only a minimal amount of noise above and beyond that which would be present in the absence of any external damping element. Thus, the arrangement of FIG. 7 achieves increased vibration damping for the system of FIG. 1 over a wide range of frequencies with minimum noise.

Although the present invention has been shown and described with respect to particular embodiments, nevertheless various changes and modifications which are obvious to a person skilled in the art to which the invention pertains are deemed to lie within the spirit, scope and contemplation of the invention.

What is claimed is:

1. In an electromechanical system including a mechanical member which is subject to vibrational movement and an electromechanical transducer mounted on said member and providing between first and second terminals an electrical signal responsive to said vibrational movement, electrical circuit means coupled between said first and second terminals for providing a negative capacitance of a value cancelling a substantial portion of the capacitance inherent in said electromechanical transducer; said electrical circuit means including an operational amplifier having a non-inverting input terminal an inverting input terminal, and an output terminal; said non-inverting input terminal being coupled to said first terminal; a capacitor coupled between said non-inverting input terminal and said output terminal; and a potentiometer coupled between said output terminal and said second terminal and having a moveable tap coupled to said inverting input terminal.

2. The system according to claim 1 wherein said electrical circuit means provides a negative capacitance having a magnitude substantially the same as that of said capacitance inherent in said electromechanical transducer.

3. The system according to claim 2 wherein the magnitude of said negative capacitance is not exactly equal to the magnitude of said inherent capacitance.

4. The system according to claim 1 wherein said capacitor provides a capacitance substantially equal to said capacitance inherent in said electromechanical transducer.

5. The system according to claim 4 wherein said potentiometer tap is set to feed back approximately half of the voltage at said output terminal to said inverting input terminal.

6. The system according to any of claims 2, 3, 1, 4 or 5 wherein a resistive element is coupled between said first and second terminals to provide damping of the vibrational movement of said mechanical member.

7. The system according to claim 6 where said resistive element is an absorbor.

* * * * *